United States Patent [19]

Hamilton, II

[11] 4,090,184

[45] May 16, 1978

[54] TOUCH CONTROLLED SWITCH SYSTEM OPERABLE BY TOUCH INPUTS AND CODED MESSAGE SIGNALS TRANSMITTED OVER POWER LINE

[76] Inventor: William F. Hamilton, II, 1512 Miramar Beach, Santa Barbara, Calif. 93108

[21] Appl. No.: 705,712

[22] Filed: Jul. 15, 1976

[51] Int. Cl.² .......................................... H04M 11/04
[52] U.S. Cl. .................................... 340/310 A; 307/3; 340/365 C
[58] Field of Search ....................... 340/310 A, 365 C; 307/3, 116; 317/DIG. 2

[56] References Cited

U.S. PATENT DOCUMENTS

| | | | |
|---|---|---|---|
| 3,492,440 | 1/1970 | Cerbone | 340/365 C |
| 3,558,902 | 1/1971 | Casey | 340/310 A |
| 3,974,472 | 8/1976 | Gould | 340/365 C |
| 3,978,468 | 8/1976 | Bond | 340/310 A |

Primary Examiner—Thomas B. Habecker

Attorney, Agent, or Firm—Charles P. Boukus, Jr.

[57] ABSTRACT

A touch controlled switch system operable by human touch inputs includes an intercommunication feature to enable communication between remote touch controlled switch units over a power line. The system comprises a transmitting unit including a first touch receptor operable by touch inputs for applying coded message signals to the power line and a receiving unit including a second touch receptor operable by touch inputs and a control switch circuit for operating a load coupled to the circuit in response to touch inputs applied to the second touch receptor. The receiving unit also includes a message sensing circuit responsive to the coded message signals on the power line for operating the control switch circuit in response to touch inputs applied to the first touch receptor. The system allows devices at remote locations to be operated either by touch inputs applied at remote receiving units or by touch inputs at one or more master transmitting units to generate coded message signals on the power line.

15 Claims, 6 Drawing Figures

TOUCH CONTROLLED SWITCH SYSTEM OPERABLE BY TOUCH INPUTS AND CODED MESSAGE SIGNALS TRANSMITTED OVER POWER LINE

The present invention relates to a touch controlled switch system operable by touch inputs and coded message signals on a power line and, more particularly, to a touch controlled switch system operable by hum pickup signals induced in a human body which allows a touch controlled switch circuit to be operated in response to touch inputs or coded message signals transmitted over the power line.

In the field of touch control circuitry, touch detector circuits have been developed which respond to the hum pickup signals induced in a human body by an AC power supply line. Such detector circuits include a touch receptor operable by electrical contact with the human body. In the absence of a touch input, the receptor normally produces an oscillating signal in response to the ambient AC signal derived from the power supply line. When a touch input is applied, the oscillating signal produced by the receptor changes in amplitude to indicate the occurrence of a touch input. A touch detector connected by a touch wire to the receptor responds to the change in amplitude of the oscillating signal to provide an output indicating the occurrence of a touch input. The touch detector may be used to operate a switch circuit to connect a load device to the AC power supply line. Such touch detector circuits can be employed, for example, with long touch wires and multiple receptors as a replacement for ordinary mechanical switch arrangements conventionally used in household and commercial installations.

Examples of hum pickup detector circuits are described in applicant's U.S. Pat. No. 3,784,848 entitled "Detector Circuit With Automatic Sensitivity Control and Post Detector Filtering For Touch Control Circuit" and U.S. Pat. No. 3,805,096 entitled "Coded Touch Multi-function Touch Control Switch Circuitry." Further examples are disclosed in applicant's co-pending U.S. application entitled "Touch Control Switch Circuit With Compensation For Power Supply Line Fluctuations," Ser. No. 696,631, filed June 16, 1976.

As explained in applicant's co-pending application, it is advantageous to provide hum pickup touch detector circuits which compensate for power line fluctuations to minimize the possibility of false touch outputs and to enhance the detector sensitivity. Such circuits generally include a touch detector for sensing touch inputs to the touch receptor and a reference detector responsive to the power supply signal for controlling the operation of the touch detector to eliminate the undesired effects of power line fluctuations.

Applicant has recognized that, since the above hum pickup touch detectors respond to an excitation signal derived from the power line, the touch detectors can be used not only to compensate for power supply line fluctuations but also to receive messages deliberately transmitted over the power line. In addition, applicant has found that his touch detector circuits with compensation features are especially suitable for receiving such messages because the detector circuits specifically require the direct introduction of signals from the power line via a controlled path, i.e., the reference detector.

The present invention utilizes the capability of applicant's hum pickup touch detector circuits to respond to messages on the power supply line in novel transmitting and receiving arrangements to enable coded message signals to be superimposed on the power supply signal and to enable a touch detector circuit to respond either to its own touch inputs or to the coded message signals. The invention advantageously enables the operation of one or more touch detector circuits to be controlled either by local touch inputs or in response to remote touch inputs which generate the coded message signals on the power supply line.

An object of the present invention is to provide a touch controlled switch system operable by touch inputs and coded message signals transmitted over a power line. Another object is to provide a touch controlled switch system which allows a touch controlled switch circuit to respond to either local touch inputs to the circuit or coded message signals transmitted over the power line in response to touch inputs at a master touch controlled switch circuit.

In addition, an object of the invention is to provide a touch controlled switch system which enables one or more master touch controlled switch circuits to selectively control a plurality of remote touch controlled switch circuits in response to touch inputs at the master touch controlled switch circuit. A further object is to allow various switch functions to be performed at the remote touch controlled switch circuits in response to different touch inputs at the master touch controlled switch circuits.

In accordance with the present invention, a touch controlled switch system operable by touch inputs and coded message signals transmitted over a power line comprises transmitting means including a first touch receptor operable by touch inputs for applying coded message signals to the power line, and receiving means including a second touch receptor operable by touch inputs and control switch means responsive to the second touch receptor for operating a load coupled to the control switch means in response to touch inputs applied to the second touch receptor. The receiving means includes message sensing means responsive to the coded message signals on the power line for operating the control switch means in response to touch inputs applied to the first touch receptor.

Preferably, the transmitting means includes a message code generator operable in response to different touch controlled inputs applied to the first touch receptor for applying different coded message signals to the power line corresponding to the different touch inputs and the message sensing means includes a message decoder responsive to different coded message signals applied to the power line for operating the control switch means in response to the different coded message signals.

In a preferred embodiment of the invention, the transmitting means comprises a first touch controlled switch circuit including a first touch receptor operable by electrical contact with a human body in response to an induced hum pickup signal derived from an AC power supply signal on the power line and a message code generator responsive to the first touch receptor for superimposing coded message signals on the AC power supply signal upon the occurrence of touch inputs at the first touch receptor. The receiving means comprises a second touch controlled switch circuit including a second touch receptor operable by electrical contact with the human body in response to the induced hum pickup signal derived from the AC power supply signal and a control circuit responsive to the second touch receptor for operating a device coupled to the control circuit upon the occurrence of touch inputs at the second touch receptor. The second touch controlled switch circuit includes a message detector coupled to the power line for detecting the coded message signals superimposed on the power supply signal and a message decoder responsive to the message detector for selectively operating the control circuit in response to the coded message signals.

Preferably, the first touch controlled switch circuit includes a first touch detector coupled to the first touch receptor for sensing touch inputs applied to the first touch receptor and a touch decoder responsive to the first touch detector for identifying different touch inputs while the message code generator comprises a message selection circuit responsive to the first touch decoder for generating different binary message signals to be applied to the power supply signal in responsive to the different touch inputs. The second touch controlled switch circuit includes a second touch detector coupled to the second touch receptor for sensing touch inputs applied to the second touch receptor and a second touch decoder responsive to the second touch detector for identifying different touch inputs and selectively operating the control circuit in response to the different touch inputs. Preferably, the message code generator includes a bit generator responsive to the message selection circuit for applying the binary message signals as a plurality of bits to the AC power supply signal. The bits are preferably applied to successive cycles of the power supply signal at predetermined points in the cycles. For example, each binary message signal may consist of a series of bits superimposed at or near successive peaks of the power supply signal. Further, the second touch control switch circuit preferably includes a bit identifier coupled to the message detector for identifying the bits applied to the power supply signal and supplying the corresponding binary message signal to the message decoder.

To enable a plurality of devices to be operated at various locations, the touch controlled switch system can be embodied as a transmitting unit including a first touch receptor operable by touch inputs for applying coded message signals to the power line in response to touch inputs applied to the first touch receptor and a plurality of receiving units each including a second touch receptor operable by touch inputs, a second touch detector for sensing touch inputs applied to the second touch receptor, and control switch means responsive to the second touch detector for operating a device in response to touch inputs applied to the second touch receptor. Each receiving unit includes message sensing means responsive to the coded message signals on the power line for operating its control switch means in response to the coded message signals.

Preferably, the transmitting unit includes a message code generator operable in response to different touch inputs applied to the first touch receptor for applying different coded message signals to the power line. Each coded message signal includes address signals to identify the desired receiving unit to be operated and command signals to identify the desired switch function to be performed. The message sensing means of each receiving unit includes a message decoder responsive to the address signals which identify the receiving unit for operating its corresponding control switch means in response to the command signals.

The invention provides a touch controlled switch system with the capability of intercommunication between touch controlled switch circuits via the power supply line. The system permits a touch controlled switch circuit to be operated in response to local touch inputs to the circuit or in response to coded message signals on the power line generated by remote touch inputs. The system is particularly advantageous in enabling the control of one or more remote touch controlled switch circuits by one or more master touch controlled switch circuits. Thus, a plurality of remote circuits can be selectively operated either from a single control point or from multiple control points. In addition, the necessity of long touch wires can be eliminated by transmission of the control signals over the power line rather than the touch wires. When used in the environment of conventional household or commercial wiring, the master and remote touch contolled switch circuits may be embodied as plug-in units which can be conveniently connected to any outlet of the power wiring.

Alternatively, the invention may be embodied as a touch controlled switch system comprising transmitting means including a touch receptor operable by touch inputs for applying coded message signals to the power line and first control switch means responsive to the touch receptor for operating a first load coupled to the control switch means in response to touch inputs applied to the touch receptor, and receiving means including second control switch means for operating a second load coupled to the second control switch means and message sensing means responsive to the coded message signals on the power line for operating the second control switch means in response to touch inputs applied to the touch receptor. Preferably, the receiving means includes a second touch receptor operable by touch inputs and coupled to the second control switch means for operating the second load in response to touch inputs applied to the second touch receptor. This arrangement allows two separate load devices to be controlled simultaneously by a single transmitting unit.

Further, to avoid the necessity of a long touch wire to the touch receptor, the system may be embodied as a transmitting unit including a touch receptor operable by electrical contact with a human body in response to the induced hum pickup signal for applying coded message signals to the power line in response to touch inputs applied to the touch receptor and a receiving unit including a control circuit for operating a load coupled thereto and message sensing means responsive to the coded message signals on the power line for operating the control circuit in response to the touch inputs at the touch receptor.

The accompanying drawings illustrate preferred embodiments of the invention and, together with the description, serve to explain the principles of the invention.

GENERAL DESCRIPTION OF SYSTEM

Figure 1:
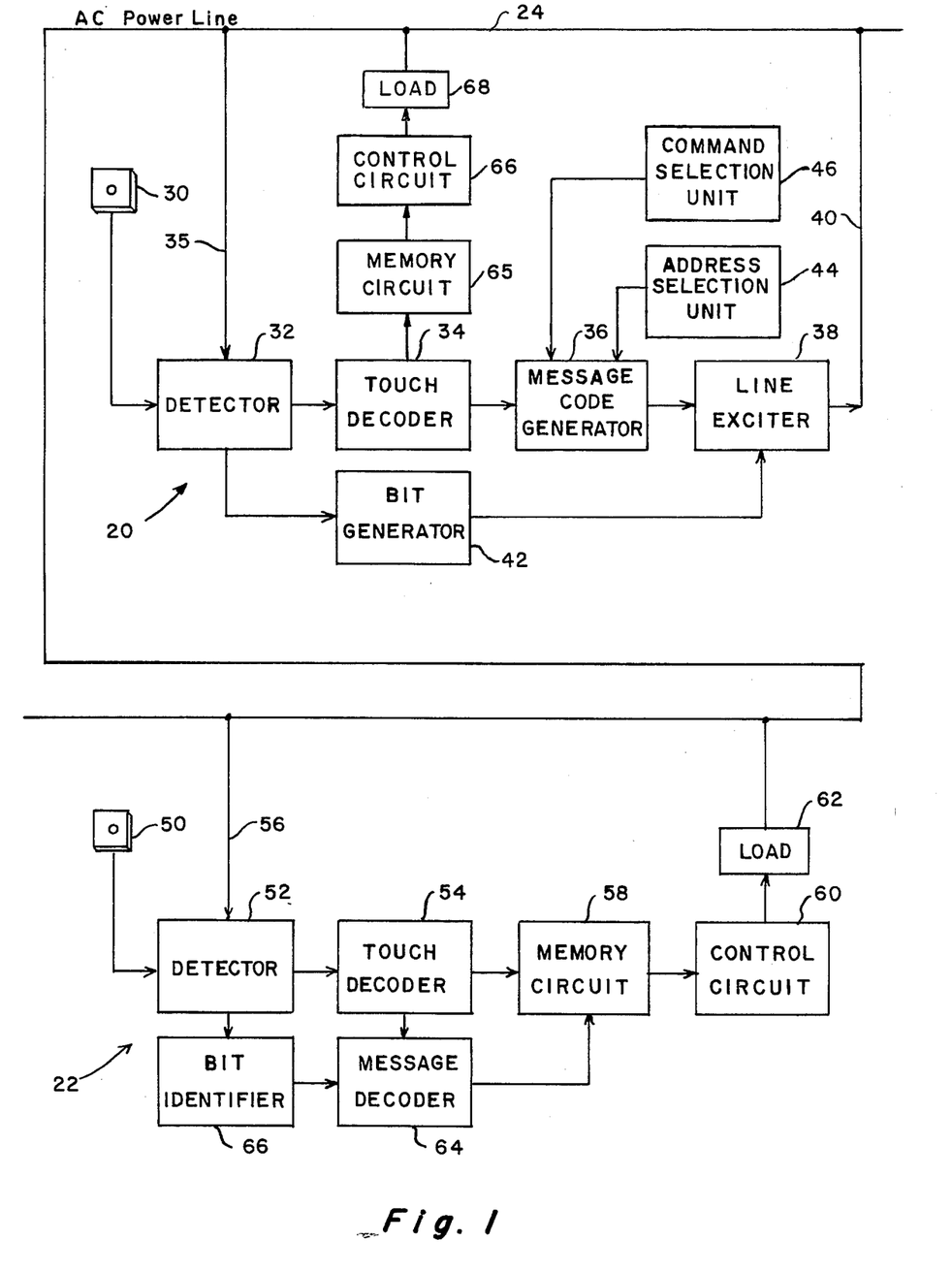
FIG. 1 is a block diagram of the basic components of a transmitting unit and a receiving unit of the touch controlled switch system coupled to a power supply line.

Referring to FIG. 1, the touch controlled switch system is embodied as a transmitting unit, generally 20, and a receiving unit, generally 22, coupled to an AC power supply line 24. Although, for convenience, only one transmitting unit 20 and one receiving unit 22 are illustrated, it is understood that a plurality of such transmitting and receiving units may be coupled to the power supply line within the scope of the present invention. Each receiving unit may, for example, be arranged to control a load device such as a lighting fixture, lamp or electrical appliance in response to touch inputs at the receiving unit or in response to coded message signals on the power supply line generated by touch inputs at the transmitting unit. In addition, each transmitting unit may, if desired, be arranged to control its own load device in response to touch inputs at the transmitting unit. Alternatively, the receiving unit may be arranged without a touch receptor to respond only to message signals transmitted over the power line and operate its load device in response to touch inputs at the transmitting unit.

Transmitting unit 20 comprises a touch controlled switch circuit including a touch receptor 30 operable by touch inputs, a detector 32 for sensing touch inputs applied to touch receptor 30, and a touch decoder 34 responsive to touch detector 32 for identifying different touch inputs to the receptor. Detector 32 is also coupled to power supply line 24 via a conductor 35 to provide compensation for fluctuations in the power supply signal as described in applicant's co-pending application entitled "Touch Control Switch Circuit With Compensation For Power Supply Line Fluctuations".

The transmitting unit also includes a message code generator 36 operable in response to different touch inputs to touch receptor 30 for applying different coded message signals corresponding to the different touch inputs to the power line via a line exciter 38 and a conductor 40. A bit generator 42 responsive to detector circuit 32 is coupled to line exciter 38 to apply the coded message signals to power line 24 as a plurality of bits at predetermined points in the power supply signal. Transmitting unit 20 may also be provided with an address selection unit 44 for supplying address signals to message code generator 36 identifying desired receiving units to be operated and a command selection unit 46 for supplying command signals to the message code generator identifying desired switch functions to be performed at the receiving units.

Each receiving unit 22 comprises a touch controlled switch circuit including a touch receptor 50 responsive to touch inputs, a detector 52 for sensing touch inputs applied to the touch receptor, and a touch decoder 54 responsive to detector 52 for identifying different touch inputs applied at the receptor. Detector 52 is also coupled to power supply line 24 via a conductor 56 to provide compensation for fluctuations in the power supply signal as described in applicant's co-pending U.S. application entitled "Touch Control Switch Circuit With Compensation For Power Supply Line Fluctuations".

The receiving unit also includes a memory circuit 58 coupled to the output of touch decoder 54 and a control circuit 60 responsive to the output of memory circuit 58 for operating a load 62. The above described touch control switch circuitry of receiving unit 22, with the exception of the compensation arrangement, is substantially similar to the multi-function touch control switch circuitry disclosed in applicant's U.S. Pat. No. 3,805,096.

In addition, each receiving unit 22 includes message sensing means responsive to the coded message signals on the power line for operating the control circuit in response to touch inputs applied at the touch receptor of the transmitting unit. The message sensing means is embodied as a message decoder 64 which responds to the different coded message signals applied to the power line via detector 52 and a bit identifier 66 for operating control circuit 60 via memory 58 in response to the different coded message signals.

Generally, in the operation of the touch controlled switch system of the present invention, each receiving unit 22 can be operated by touch inputs at its receptor 50 or by coded message signals transmitted over the power supply line to control its corresponding load 62. Detector 52 responds to each touch input at receptor 50 to change the state of memory circuit 58 and to operate control circuit 60 to switch load 62 alternately on and off. Touch decoder 54 enables the receiving unit to discriminate between different, e.g., short and long, touch inputs. Memory circuit 58 responds to the different touch inputs determined by touch decoder 54 to select different control functions to be performed by control circuit 60 in response to the different touch inputs. For example, a short input can be used to turn on control circuit 60 and operate load 62 at half power, while a long touch input can be used to turn on the control circuit and operate the load at full power. The same control functions can be achieved in response to coded message signals on the power line which are sensed by bit identifier 66 and decoded by message decoder 64. The message decoder controls the operation of touch decoder 54 and memory circuit 58 to accomplish the on, off, full-power and half-power functions described above.

Transmitting unit 20 can be operated by touch inputs at its receptor 30 to apply the coded message signals to the power supply line. Touch detector 32 and touch decoder 34 respond to each touch input at receptor 30 to actuate message code generator 36 to superimpose coded message signals selected by address selection unit 44 and command selection unit 46 on the power supply signal via line exciter 38. Bit generator 42 insures that the coded message signals are superimposed at predetermined points in successive cycles of the power supply signal.

In the preferred embodiment, described in more detail below, the bit generator 42 applies the coded message signals as a plurality of bits at successive peaks of the power supply signal. However, it is not necessary that the bits appear exactly at the peaks of the power supply signal. A bit generator which superimposes the bits near the power supply peaks, e.g., when the line voltage is above one-half or one-third of its peak value, can be used. The bits can be superimposed either before or after the peaks. Further, by different phasing of bit signals, several control systems may co-exist independently even though identical message codes are used. Such an arrangement may be desirable in apartment buildings or large residences. The necessary phasing can be achieved by the use of suitable R-C lead or lag circuits in the reference detector connections to the AC power line in both the transmitting and receiving units.

Address selection unit 44 and command selection unit 46 enable the transmitting unit to select binary address signals to identify the desired receiving units to be operated and binary command signals, e.g., on, off, change, full-power and half-power commands, to identify the desired switch functions to be performed. In addition, touch decoder 34 enables the transmitting unit to discriminate between different, e.g., short and long, touch inputs at receptor 30. Command selection unit 46 can be arranged to generate a half-power command in response to a short touch input and a full-power command in response to a long touch input.

The system can be used, for example, in connection with conventional household or commercial AC wiring to facilitate control of various electrical devices connected to the power wiring. For example, the system can be advantageously employed to allow household lights and appliances located in various rooms to be operated by one or more master transmitting units connected to the power wiring at central locations, e.g. kitchen, entry hall, or master bedroom. It is contemplated that the transmitting and receiving units can be embodied as permanently wired components of the household power wiring, as separate plug-in units connected to conventional electrical outlets of the power wiring, or as a combination of both.

The master transmitting unit is generally arranged to communicate by coded message signals with each of the receiving units in the system. However, it may be desirable to employ one or more transmitting units which communicate only with specific receiving units. For example, to avoid the necessity of a long touch wire, it may be desirable to locate a transmitting unit near a touch receptor for communication over the power supply line with a specific receiving unit. It is not necessary, in such an arrangement, for the specific receiving unit to include a touch receptor. Further, where two separate devices are to be controlled simultaneously, a transmitting unit with its own control circuit may be provided to control one of the devices, while a receiving unit, which is essentially slaved to the transmitting unit, may be provided to control the other device. This arrangement can be achieved by the addition of a memory circuit 65, control circuit 66, and load 68 (shown in phantom lines in FIG. 1), which are substantially identical to memory circuit 58, control circuit 60, and load 62 of the receiving unit, between touch decoder 34 and AC power line 24.

DETAILED DESCRIPTION OF TRANSMITTING UNIT

Figure 2:
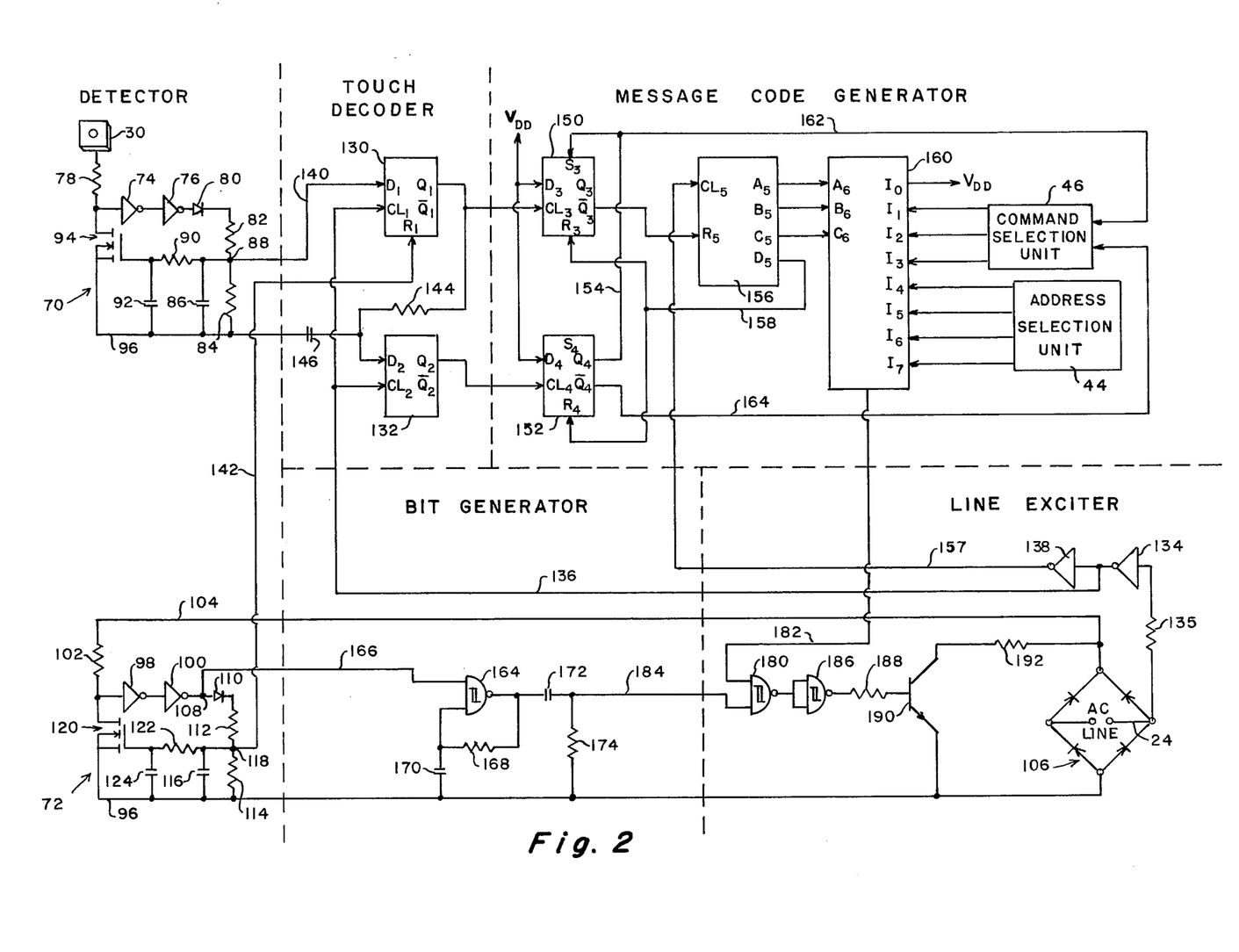
FIG. 2 is a detailed circuit diagram of the transmitting unit of the system.

Referring to FIG. 2, the detector circuitry of the transmitting unit comprises a touch detector, generally 70, responsive to touch receptor 30 and a reference detector, generally 72, coupled to AC power supply line 24. Touch detector 70 and reference detector 72 are substantially identical to the corresponding touch detector and reference detector illustrated in FIG. 4 of applicant's co-pending U.S. application entitled "Touch Control Switch Circuit With Compensation For Power Supply Line Fluctuations." Alternatively, the touch detector and reference detector illustrated in FIG. 1 of applicant's co-pending application can be used in the transmitting unit.

Touch detector 70 includes a pair of CMOS inverters 74 and 76 which respond to inputs to touch receptor 30 via a resistance 78. The output of inverter 76 is coupled to an average voltage detector circuit comprising a diode 80, a pair of series resistances 82 and 84, and a capacitor 86 coupled across resistance 84. The junction between resistances 82 and 84 provides a detector output terminal 88. In addition, touch detector 70 includes a low pass filter comprising a resistor 90 and a capacitor 92 in a feedback arrangement with a field effect transistor (FET) 94 connected in shunt between the input of inverter 74 and a common line 96. When the input signal applied to inverter 74 exceeds a predetermined threshold voltage, the output of inverter 76 changes from low to high.

Reference detector 72 is substantially similar in circuitry to touch detector 70. The reference detector incorporates a pair of CMOS inverters 98 and 100 coupled to AC power supply line 24 via a resistance 102, a conductor 104, and a full-wave bridge rectifier circuit 106. The output of inverter 100 provides a first detector output terminal 108 which is coupled to an average voltage detector circuit comprising a diode 110, a pair of series resistances 112 and 114, and a capacitor 116 coupled across resistance 114. The junction of resistances 112 and 114 provides a second detector output terminal 118. The reference detector also includes a feedback arrangement consisting of a FET 120 and a low-pass filter comprising a resistance 122 and a capacitance 124.

As shown in FIG. 2, the transmitting unit includes a touch decoder comprising a pair of flip-flops 130 and 132. Both flip-flop have clock input terminals $CL_1$ and $CL_2$ which are driven in synchronism with the power supply signal via an inverter 134 coupled to AC power line 24 by a coupling resistance 135. The output terminal of inverter 134 is connected by a conductor 136 to the clock input terminals of flip-flops 130 and 132. A second inverter 138 coupled to the output of inverter 134 provides an inverse clock signal.

Output terminal 88 of touch detector 70 is coupled by a conductor 140 to a data input terminal $D_1$ of flip-flop 130. Output terminal 118 of reference detector 72 is coupled by a conductor 142 to a reset terminal $R_1$ of the flip-flop. Reference detector 72 produces a high output signal only in response to power supply line voltage fluctuations, i.e., changes in amplitude. On the other hand, touch detector 70 produces a high output signal at terminal 88 either in response to a touch input or to a fluctuation in power supply line voltage. As a result, the output signal produced by reference detector 72 at terminal 118 prevents a high output signal at output $Q_1$ of flip-flop 130 due to line voltage fluctuations. A high signal can appear at output terminal $Q_1$ only when a touch input at receptor 30 causes the output voltage at terminal 88 to rise in the absence of power line voltage fluctuations.

Output terminal $Q_1$ of flip-flop 130 is connected to a data input terminal $D_2$ of flip-flop 132 via an RC circuit comprising a resistance 144 and a capacitance 146. In the absence of power supply voltage fluctuations, flip-flop 130 provides a high output signal at its output terminal $Q_1$ each time a touch input occurs at touch receptor 32. However, since it is necessary for capacitor 146 to charge to a predetermined level to actuate flip-flop 132, a high output signal appears at output $Q_2$ of flip-flop 132 only after long or sustained touch inputs. Thus, the touch decoder allows the touch controlled switch circuitry to discriminate between short and long touch inputs. When a short touch input is applied to touch receptor 30, a high output signal will appear only at output terminal $Q_1$ of flip-flop 130. However, when a long touch input is applied to the touch receptor, high output signals will appear at both output terminals of $Q_1$ and $Q_2$ of flip-flop 130 and 132, respectively.

The transmitting unit further includes a message code generator provided with a pair of flip-flops 150 and 152 each having data input terminals $D_3$ and $D_4$ coupled to a fixed voltage source $V_{DD}$. Flip-flop 150 has its clock input terminal $CL_3$ driven by output terminal $Q_1$ of flip-flop 130, while flip-flop 152 has its clock input terminal $CL_4$ driven by output terminal $Q_2$ of flip-flop 132. Output terminal $Q_4$ of flip-flop 152 is connected by a conductor 154 to a set terminal $S_3$ of flip-flop 150. The message code generator also includes a counter 156 having a clock input terminal $CL_5$ driven by the inverse clock signal provided by inverter 138 via a conductor 157. Counter 156 has a reset terminal $R_5$ coupled to output terminal $\overline{Q}_3$ of flip-flop 150. Counter 156 also includes a series of binary output terminals $A_5 - D_5$. Output terminal $D_5$ of the counter is coupled by a conductor 158 to reset terminals $R_3$ and $R_4$ of flip-flops 150 and 152, respectively. The three least significant binary output terminals ($A_5$, $B_5$ and $C_5$) of counter 156 are employed to drive corresponding inputs $A_6$, $B_6$ and $C_6$ of a multiplexer 160.

Multiplexer 160 is provided with eight (8) data input terminals $I_0 - I_7$. Input terminal $I_0$ is connected to fixed voltage source $V_{DD}$ which provides a voltage level representing a binary "1" signal. This input signal at terminal $I_0$ insures that all message signals begin with a binary "1" signal. Input terminals $I_1 - I_3$ receive binary signals from the outputs of command selection unit 46. Outputs $Q_4$ and $\overline{Q}_4$ of flip-flop 152 are coupled via conductors 162 and 164, respectively, to the inputs of command selection unit 46. The command selection unit may, for example, have three switch positions corresponding to ON, OFF, and CHANGE commands which permit selection of different combinations of binary output signals representing the various commands. In addition, upon detection of a long touch input, the command selection unit can be switched in response to a high output signal at output terminal $Q_4$ of flip-flop 152 to generate a combination of binary output signals representing a LONG command.

When flip-flop 150 is set in response to a touch input at receptor 30, its output terminal $\overline{Q}_3$ produces a low output signal to allow counter 156 to advance with each negative transition of the inverse clock signal provided by inverter 138. The counter advances from zero through seven and, at a count of eight, its output terminal $D_5$ produces a high output signal to reset flip-flop 150 and terminate the counter operation. The three least significant digits $A_5$, $B_5$ and $C_5$ produced by counter 156 are applied to multiplexer 160 to sequentially select its eight data inputs $I_0-I_7$ for connection to its output terminal.

Reference detector 72 suppresses any response by flip-flop 130 to the output of touch detector 70 during line voltage changes. The reference detector also provides synchronizing pulses at its output terminal 108 for operating the bit generator of the transmitting unit at the peaks of the AC power supply voltage.

The bit generator of the transmitting unit comprises a Schmitt trigger 164 coupled by a conductor 166 to output terminal 108 of reference detector 72. Schmitt trigger 164 is enabled by the synchronizing pulses produced by the reference detector. The Schmitt trigger includes internal positive feedback to provide a NAND operation, i.e., its output terminal produces a low output signal only when high input signals are applied to both of its input terminals. A feedback network comprising a resistor 168 and a capacitor 170 is provided to operate the Schmitt trigger as an astable multivibrator when it is enabled by the synchronizing pulses.

Initially, Schmitt trigger 164 provides a high output signal which charges capacitor 170 to provide a high input signal at the corresponding input terminal of the Schmitt trigger. When a synchronizing pulse raises the other input terminal of Schmitt trigger 164 to a high level, its output signal changes abruptly to a low level. As a result, capacitor 170 is discharged via resistor 168 until a low input signal appears at the corresponding input terminal of the Schmitt trigger and its output terminal returns to a high level. The above operation of Schmitt trigger 164 is repeated as long as the output pulse from a reference detector 72 persists.

The output pulses produced by Schmitt trigger 164 are applied to a differentiator comprising a capacitor 172 and a resistor 174. The differentiator produces short positive pulses, e.g., a series of pulses approximately 1 microsecond in duration and separated by 80 microsecond intervals, which are applied to the line exciter.

The line exciter of the transmitting unit comprises a Schmitt trigger 180, which functions as a NAND gate, having a first input terminal coupled by a conductor 182 to the output terminal of multiplexer 160 and a second input terminal coupled by a conductor 184 to the differentiator output. NAND gate 180 has an output terminal connected via an inverter 186 and a coupling resistance 188 to the base of a transistor 190. The transistor output is, in turn, coupled to AC power line 24 via a resistance 192 and bridge rectifier circuit 106.

Figure 5:
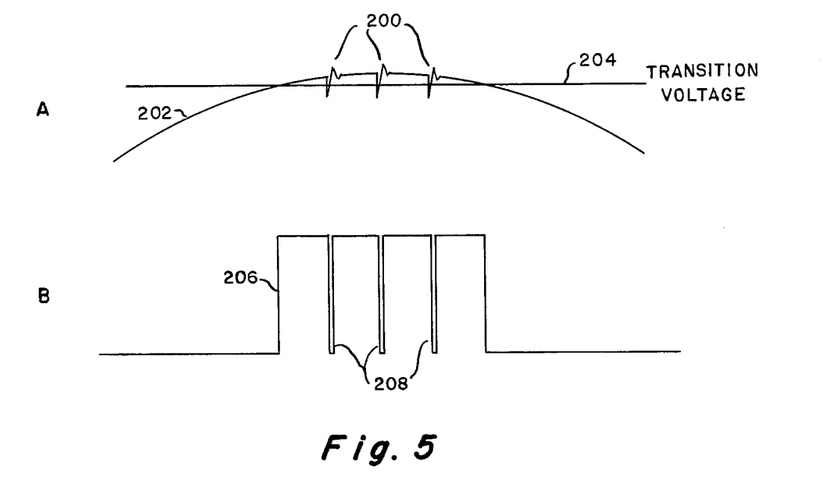
FIGS. 5A and 5B are waveforms illustrating the power supply signal with coded message signals superimposed at the peak of the power supply signal and the corresponding pulses produced at the receiving unit.

If the output of multiplexer 160 is at a high level, corresponding to a binary "1" signal, the output of NAND gate 180 is pulsed to a low level each time a positive pulse is produced by the differentiator circuit of the bit generator. The low output pulses produced by NAND gate 180 are inverted and used to turn on transistor 190 to draw brief current pulses from AC power line 24 through resistance 192. Referring to FIG. 5A, the brief current pulses result in a series of small disturbance 200 at the peak of the power supply signal (shown as waveform 202) which represent a binary "1" signal. On the other hand, if the multiplexer output is at a low level, corresponding to a binary "0" signal, the output terminal of NAND gate 180 remains high even when the output pulses from the differentiator of the bit generator are applied. Consequently, a low output signal appears at the output terminal of inverter 186 to turn off transistor 190. As a result, no disturbances appear at the peak of the power supply signal. The absence of such disturbances represents a binary "0" signal.

Since reference detector 72 is coupled to AC power supply line 24 via full-wave bridge rectifier circuit 106, two positive half cycles are applied to the reference detector during each power line cycle. Thus, reference detector 72 produces output pulses during both the positive and negative AC line peaks. As a result, the bit generator produces bit pulses at both positive and negative half cycles of the power supply signal. Referring to FIG. 5A, the line exciter superimposes disturbances on the AC power supply signal in accordance with the multiplexer signal at both the positive and negative line voltage peaks. This arrangement permits the transmitting and receiving units to be connected to AC power wiring of either polarity.

As mentioned above, it is also possible to superimpose the bit pulses before or after the peaks of the power supply signal. However, the line voltage must be sufficiently large to produce a substantial current flow when transistor 190 of the line exciter is turned on. This requirement is satisfied by a line voltage which exceeds one-half or one-third of the peak value.

Detailed Description of Receiving Unit

Figure 3:
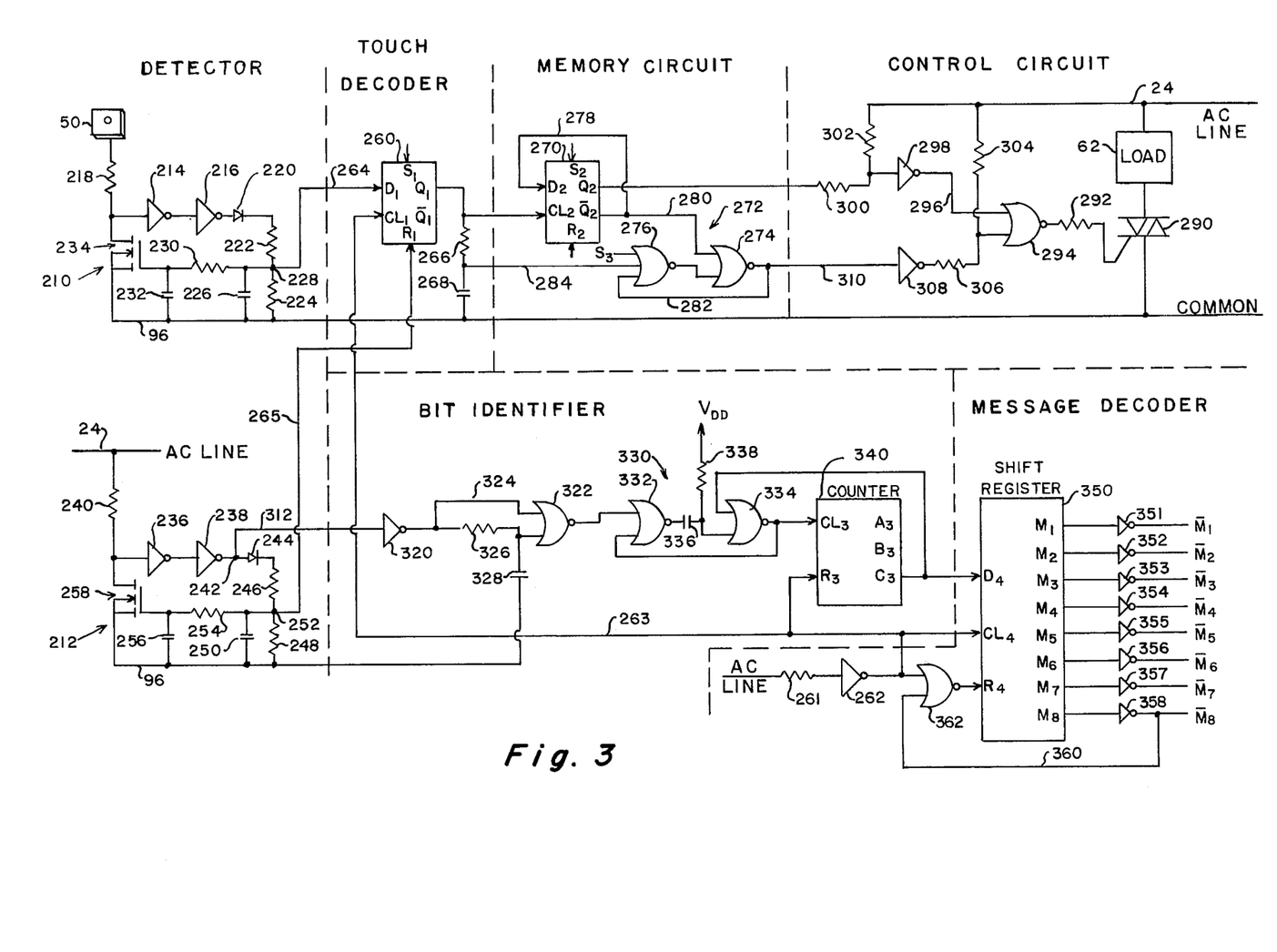
FIG. 3 is a detailed circuit diagram of the receiving unit of the system.

Referring to FIG. 3, the receiving unit detector circuit comprises a touch detector, generally 210, for sensing touch inputs applied to touch receptor 50 and a reference and message detector, generally 212, responsive to AC power line 24 for sensing power supply line fluctuations and detecting coded message signals superimposed on the power supply signal. Touch detector 210 and reference detector 212 are substantially identical to the touch detector and reference detector illustrated in FIG. 4 of applicant's co-pending U.S. application entitled "Touch Control Switch Circuit With Compensation For Power Supply Line Fluctuations" Alternatively, the touch detector and reference detector of FIG. 1 of applicant's co-pending application can be used in the receiving unit.

Touch detector 210 includes a pair of CMOS inverters 214 and 216 which respond to inputs to touch receptor 50 via a resistance 218. The output of inverter 216 is applied to an average voltage detector circuit comprising a diode 220, a pair of series resistances 222 and 224, and a capacitor 226 coupled across resistance 224. The junction of resistances 222 and 224 provides an output terminal 228 of the touch detector. In addition, touch detector 210 includes a low-pass filter comprising a resistor 230 and a capacitor 232 in a feedback arrangement with a FET 234 connected in shunt between the input terminal of inverter 214 and common or ground line 96. The output terminal of inverter 216 switches from low to high when the input signal applied to inverter 214 exceeds a predetermined threshold level.

Reference detector 212 is substantially similar in circuitry to touch detector 210. The reference detector incorporates a pair of CMOS inverters 236 and 238 coupled to AC power supply line 24 via a resistance 240. Inverter 238 provides a first output terminal 242 of the reference and message detector which produces output pulses in response to the disturbances on the AC power supply signal. Output terminal 242 of inverter 238 is connected to an average voltage detector circuit comprising a diode 244, a pair of series resistances 246 and 248, and a capacitor 250 coupled across resistance 248. The junction of resistances 246 and 248 provides a second output terminal 252 of the reference detector. In addition, reference detector 212 includes a low-pass filter comprising a resistance 254 and a capacitance 256 in a feed-back arrangement with a FET 258 connected in shunt between the input terminal of inverter 236 and common or ground line 96.

The touch decoder of the receiving unit comprises a flip-flop 260 having a clock input $CL_1$ driven in synchronism with the power supply signal on AC power line 24 via a resistor 261, an inverter 262 and a conductor 263. Flip-flop 260 also includes a data input $D_1$ coupled via a conductor 264 to output terminal 228 of touch detector 210. In addition, the flip-flop has a reset terminal $R_1$ coupled via a conductor 265 to output terminal 252 of reference detector 212. The touch decoder also includes a low-pass filter comprising a resistance 266 and a capacitance 268 coupled to an output terminal $Q_1$ of flip-flop 260.

Reference detector 212 produces a high output signal at output terminal 252 only in response to power supply line voltage fluctuations. On the other hand, touch detector 210 produces a high output signal at output terminal 228 either in response to a touch input at receptor 50 or to a fluctuation in power supply line voltage. Consequently, a high output signal at terminal 252 of the reference detector in response to a fluctuation in the power supply voltage precludes a high output at output terminal $Q_1$ of flip-flop 260. Output terminal $Q_1$ of flip-flop 260 can only produce a high output signal when a touch input at receptor 50 results in a high output signal at terminal 228 of touch detector 210 in the absence of power line fluctuations.

In the absence of power supply line fluctuations, output terminal $Q_1$ of flip-flop 260 is driven to a high level by every touch input to receptor 50. On the other hand, a high output signal appears across capacitance 268 only in response to long touch inputs to receptor 50. Thus, the touch decoder enables the receiving unit to discriminate between different, i.e., short and long, touch inputs. When a short touch input is applied to receptor 50, output terminal $Q_1$ of flip-flop 260 is driven high while the output across capacitance 268 remains low. When a long touch input is applied at receptor 50, high output signals appear both at output terminal $Q_1$ of flip-flop 260 and across capacitance 268.

The memory circuit of the transmitting unit comprises a data-type flip-flop 270 and a set-reset flip-flop 272 comprising a pair of NOR gates 274 and 276. Flip-flop 270 has a clock input $CL_2$ driven by output terminal $Q_1$ of flip-flop 260. Flip-flop 270 also has its output terminal $\overline{Q}_2$ coupled by a conductor 278 to its data input terminal $D_2$. As a result, the state of flip-flop 270 is changed in response to each touch input applied to receptor 50. Output terminal $\overline{Q}_2$ of flip-flop 270 is also coupled via a conductor 280 to a first input terminal of NOR gate 274. A second input terminal of NOR gate 274 is coupled to the output terminal of NOR gate 276. The output terminal of NOR gate 274 is coupled via a conductor 282 to a first input terminal of NOR gate 276. A second input terminal of NOR gate 276 is coupled via a conductor 284 to capacitor 268. A third input $S_3$ of NOR gate 276 is explained in more detail below. Flip-flop 272 is set by a high input signal from capacitance 268 in response to a long touch input when flip-flop 270 is set, i.e., with output terminal $Q_2$ of flip-flop 270 high and its output terminal $\overline{Q}_2$ low.

The control circuit of the receiving unit includes a triac 290 connected in series with load device 62 across AC power supply line 24 and common or ground line 96. The control terminal of triac 290 is coupled by a resistance 292 to the output terminal of a NOR gate 294. The NOR gate has a first input terminal coupled via a conductor 296 to the output terminal of an inverter 298. The input terminal of inverter 298 is coupled by a resistance 300 to output terminal $Q_2$ of flip-flop 270 and by a resistance 302 to AC power supply line 24. A second input terminal of NOR gate 294 is coupled by a resistance 304 to AC power supply line 24 and by a resistance 306 to the output terminal of an inverter 308. The input terminal of inverter 308 is coupled by a conductor 310 to the output of NOR gate 274.

When high output signals appear at both output terminal $Q_2$ of flip-flop 270 and the output terminal of NOR gate 274, the control circuit supplies trigger pulses to triac 290 during the initiation of each half cycle of the power supply signal to operate load 62 at full power. Inverter 298 applies a low input signal to the first input of NOR gate 294 whenever the AC power supply signal exceeds a negative value of a few volts. The second input of NOR gate 294 is low, i.e., below the gate transistion voltage, whenever the AC power supply signal is below a positive value of a few volts. Consequently, NOR gate 294 produces output pulses around the zero crossings of the AC power supply signal.

When a high output signal appears at output terminal $Q_2$ of flip-flop 270 and a low output signal appears at the output terminal of NOR gate 274, the control circuit supplies trigger pulses to triac 290 at alternate half cycles of the power supply signal to operate load 62 at half power. With the output terminal of NOR gate 274 low, inverter 302 supplies a high signal to the voltage divider comprising resistances 304 and 306. Thus, the second input of NOR gate 294 is low only when the AC power supply signal is below zero voltage. The output of NOR gate 294 is high at the beginning and end of each negative half cycle of the AC power supply signal to turn on triac 290 for those half cycles but not for the positive half cycles. When output terminal $Q_2$ of flip-flop 270 is also low, inverter 298 produces a low output signal only when the AC power supply signal exceeds a predetermined positive level, e.g., 10 volts. Thus, the inputs of NOR gate 294 are never simultaneously low and no trigger pulses are supplied to triac 290.

The control circuit switches load 62 alternately on and off in response to any touch input. When the control circuit is turned on in response to a short touch input at receptor 50, the control circuit supplies half power to load 62. Only if a long touch input is applied to receptor 50 to turn on the control circuit is full power applied to the load.

Reference and message detector 212 of the receiving unit serves two functions, i.e., detection of fluctuations in the power supply signal and detection of coded message signals superimposed on the power supply signal. As explained above, output terminal 252 of the reference detector is coupled to reset terminal $R_1$ of flip-flop 260 via conductor 265 to prevent the occurrence of high output signals at output terminal $Q_1$ of the flip-flop due to power supply voltage fluctuations. In addition, output terminal 242 of the reference detector is connected via a conductor 312 to a bit identifier for sensing the bits applied to the power supply signal.

Referring to FIGS. 5A and 5B, at each peak of the power supply signal, the voltage applied to reference detector 212 rises above the transistion voltage of inverter 236 for a brief fraction of the power supply cycle to produce a positive pulse 206 at the output of inverter 238. If a series of disturbances 200 are superimposed on the power supply signal, the input voltage to reference detector 212 drops below the transistion of inverter 236 at each disturbance to introduce narrow interruptions 208 in the output pulse of inverter 238. Typically, the reference detector operates at a sensitivity level such that small disturbances, on the order of 1 volt, will produce the narrow interruptions.

The bit identifier of the receiving unit is arranged to produce a high output whenever at least three interruptions appear in the detector output pulse at terminal 242. The requirement of more than a single interruption prevents repetitive disturbances, e.g., interruptions generated by an SCR lamp dimmer, from being identified as a string of message bits.

The bit identifier comprises an inverter 320 having an input terminal coupled to conductor 312 and an output terminal connected to a first input terminal of a NOR gate 322 by a conductor 324 and to a second input terminal of the NOR gate by a time delay circuit comprising a resistance 326 and a capacitance 328. The output terminal of inverter 320 is driven low at the beginning of the detector output pulse. However, only if the pulse is sufficiently long to enable capacitance 328 to discharge is the output of NOR gate 322 driven high. Thereafter, during the detector output pulse, the output signal produced by NOR gate 322 returns low for each interruption or drop in the detector output pulse. The output signal produced by NOR gate 322 is applied to a monostable (one-shot) multivibrator, generally 330, consisting of a pair of NOR gates 332 and 334, a capacitance 336 and a resistance 338 connected to voltage source $V_{DD}$. The one-shot circuit is preferably not re-triggerable to eliminate the effects of ringing on the AC line. Once the one-shot circuit is triggered on, it remains on for a predetermined period regardless of further trigger inputs. The duration of the on time is made longer than the likely duration of ringing oscillations due to a single impulse on the AC line. Thus, if the output terminal of NOR gate 332 is driven high and low in rapid succession, e.g., if the detector output pulse followed each oscillation in a single disturbance, the circuit still only produces one high output pulse. A counter 340 having a clock input terminal $CL_3$ coupled to the output of NOR gate 334 is provided to count the pulses produced by the one-shot circuit. The counter is reset via the clock signal produced by inverter 262 once each cycle of the AC power supply signal. Only if counter 340 is advanced to a count of four during a detector output pulse, is an output signal at terminal $C_3$ passed on to the message decoder.

In the message decoder of the receiving unit, output pulses from the bit identifier are applied in series to a shift register 350 having a plurality of stages or bit positions $M_1 - M_8$. Shift register 350 includes a data input $D_4$ coupled to output terminal $C_3$ of counter 340 and a clock input $CL_4$ driven by the clock signal provided by inverter 262. At the end of each cycle of the AC power supply signal, before counter 340 is reset, the binary output signal at output $C_3$ of the counter is transferred into bit position $M_1$ of the shift register, and all information already in the shift register is shifted downward by one stage. The decoding of an accumulated message begins when a bit appears in bit position $M_8$. As mentioned previously, all valid coded message signals are required to begin with a binary "1" signal in the initial bit position.

A plurality of inverters 351 – 358 is connected to the various bit positions of shift register 350 to provide inverted bit outputs designated $\overline{M}_1 - \overline{M}_8$. The output terminal of inverter 358 is coupled by a conductor 360 to a first input terminal of a NOR gate 362. A second input terminal of NOR gate 362 is coupled to the output terminal of inverter 262. The output terminal of NOR gate 362 is coupled to a reset terminal $R_4$ of shift register 350.

Figure 4:
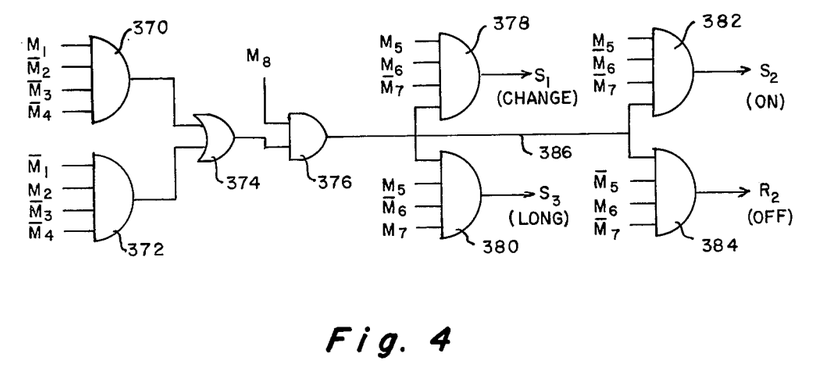
FIG. 4 illustrates a gate circuit employed with the receiving unit of FIG. 3 to identify the coded message signals trasmitted over the power supply line.

Referring to FIG. 4, the decoding of a coded message signal is accomplished by a gate circuit which produces outputs to control the touch decoder and memory of the basic multi-function touch controlled switch of the receiving unit. The gate circuit includes a first four-input AND gate 370 having its input terminals responsive to outputs $M_1$, $\overline{M}_2$, $\overline{M}_3$ and $\overline{M}_4$ of the shift register circuit. A second four-input AND gate 372 has its input terminals responsive to outputs $\overline{M}_1$, $M_2$, $\overline{M}_3$ and $\overline{M}_4$ of the shift register circuit. The output terminals of AND gates 370 and 372 are connected to the input terminals of an OR gate 374. The output terminal of OR gate 374 is connected to a first input terminal of an AND gate 376. A second input terminal of AND gate 376 is connected to output $M_8$ of the shift register.

In addition, the gate circuit includes a plurality of four-input AND gates 378, 380, 382, and 384. The output of AND gate 376 is coupled via a conductor 386 to one input of each of the AND gates. The other input terminals of AND gate 378 respond to outputs $M_5$, $M_6$ and $\overline{M}_7$ of the shift register circuit while the other input terminals of AND gate 380 respond to shift register outputs $M_5$, $\overline{M}_6$ and $M_7$. Further, the remaining input terminals of AND gate 382 respond to outputs $M_5$, $\overline{M}_6$ and $\overline{M}_7$ of the shift register circuit while the remaining input terminals of AND gate 384 respond to shift register outputs $\overline{M}_5$, $M_6$ and $\overline{M}_7$. The output terminal of AND gate 378 is connected to set terminal $S_1$ of flip-flop 260 of the touch decoder. The output terminal of AND gate 382 is connected to set terminal $S_2$ of flip-flop 270 of the memory circuit while the output terminal of AND gate 380 is connected to input terminal $S_3$ of flip-flop 272. Finally, the output terminal of AND gate 384 is connected to reset terminal $R_2$ of flip-flop 270.

The gate circuit (FIG. 4) is arranged to decode binary message signals eight (8) bits long consisting of two four-bit subsections. The first four-bit subsection includes binary command signals identifying various switch functions to be performed at the receiving unit. The second four-bit subsection includes binary address signals identifying the desired receiving units to be operated. The following table illlustrates the binary command signals and corresponding switch functions.

| BINARY COMMAND SIGNAL | SWITCH FUNCTION |
|---|---|
| 1001 | ON |
| 1010 | OFF |
| 1011 | CHANGE |
| 1101 | LONG |

The binary command signals all include an initial binary "1" bit to trigger decoding. In addition, the binary command signals include at least one binary "0" as protection against possible cyclic disturbances on the AC power line which appear in every cycle of the power supply signal. The binary command signals provide for selection of ON and OFF states as desired, or for CHANGE and LONG touch commands exactly equivalent to the operation produced by direct short and long touch inputs to local touch receptor 50.

Referring to FIG. 4, the first section of the gate circuit comprising AND gates 370 and 372, OR gate 374 and AND gate 376 is arranged to produce a high output signal when the initial binary "1" message bit arrives at bit position $M_8$ in shift register 350 and when either one of two four-bit address codes appear in message bit positions $M_1$ - $M_4$. In the gate circuit of FIG. 4, AND gate 370 responds to the address code 0001, while AND gate 372 responds to the address code 0010. The use of multiple addresses allows the system to select either a single touch controlled switch circuit or a group of touch controlled switch circuits for operation.

The second section of the gate circuit comprising AND gates 378, 380, and 382 and 384 is used to produce high output signals corresponding to the four commands described in the above table. These gates can produce high output signals only when the output signal provided by AND gate 376 is high indicating a message addressed to the receiving unit. AND gate 382 produces a high output signal in response to an ON command 1001 which is applied to set terminal $S_2$ of flip-flop 270. AND gate 384 provides a high output signal in response to an OFF command 1010 which is applied to reset terminal $R_2$ of flip-flop 270. A CHANGE command 1011 results in a high signal at the output terminal of AND gate 378 to set flip-flop 260 for one cycle of the AC power supply signal to toggle flip-flop 270. A LONG command 1101 results in a high signal at the output of AND gate 380 to set memory flip-flop 272.

Referring to FIG. 3, shift register 350 is reset by a clock pulse from inverter 262 when a binary "1" appears in bit position $M_8$. The clock phasing is arranged to reset the shift register one-half cycle of the power supply signal after the arrival of the binary "1" in bit position $M_8$. The output of inverter 262 is driven high during negative half cycles of the AC power supply signal. The shift register advances at positive transitions of the inverter output. However, NOR gate 362 provides the reset signal to the shift register only a half cycle later when the output of inverter 262 returns low.

Referring to FIG. 2, the 8-bit coded message signal superimposed on the power supply signal is derived from the binary signals applied to data input terminals $I_0$ - $I_7$ of multiplexer 160. The signals applied to inputs $I_0$ - $I_3$ constitute the binary command signals, while the signals applied to inputs $I_4$ - $I_7$ constitute the binary address signals. The constant input voltage $V_{DD}$ applied to input $I_0$ satisfies the requirement that the first bit of each command code comprise a binary "1". The remaining bits of the command code are determined by command selection unit 46 according to the above table. Address selection unit 44 supplies a combination of four binary signals to inputs $I_4$ - $I_7$ of multiplexer 160 which comprise the four bits of the address code. When the multiplexer is actuated by counter 156, the binary signals at inputs $I_0$ - $I_7$ are supplied in sequence to the multiplexer output, beginning with $I_0$ and progressing downward through input $I_7$.

Referring to FIG. 3, when the coded message signals are received at shift register 350 of the receiving unit, the first bit of the command code, which is always a binary "1" signal, is moved to bit position $M_8$, while the second, third and fourth bits of the command code are moved into bit positions $M_7$, $M_6$, and $M_5$, respectively. Similarly, the first bit of the address code, generated at input $I_4$ of multiplexer 160 (FIG. 2) is moved into bit position $M_4$ of shift register 350 (FIG. 3) while the second, third and fourth bits of the address code are moved into bit positions $M_3$, $M_2$ and $M_1$, respectively. Thus, for example, if an OFF command code 1010 is generated at inputs $I_0$ - $I_3$ of the multiplexer, this same command code is received at bit positions $M_8$, $M_7$, $M_6$ and $M_5$ of the shift register. As a result, if the coded message signal is directed to the receiving unit, AND gate 384 (FIG. 4)

is actuated to reset flip-flop 270 (FIG. 3) to turn off the control circuit. The operation of the gate circuit of FIG. 4 is similar in response to the other command codes which can be received.

It is also contemplated that alternative message code signalling techniques may be employed with the scope of the present invention in place of the impulsive technique previously described. For example, high frequency tones, which may be as high as several hundred KHz without resonance on a typical AC wiring system, can be used. The message codes may be in the form of different frequencies, different durations, or different timing of tone bursts relative to the AC power supply signal. Tone signals of sufficient amplitude would cause the detector of FIG. 3 to produce pulse outputs at the tone frequency while the AC line voltage is near the transistion voltage illustrated in FIG. 5A. However, the primary advantages of tone signalling can be achieved by use of a narrow band filter tuned to the tone frequency located at the input to the receiving unit to enhance the signal-to-noise ratio.

Another alternative is impulsive signalling in which the impulses increase, rather than decrease, the line voltage. Since, as indicated in FIG. 5A, impulsive signalling generally excites line oscillations, the second or negative half-cycles of such signals, rather than the first half-cycles, would be detected by the detector of the receiving unit. Alternatively, the positive excursions can be timed to occur just before or just after the usual detector output pulse 206 (FIG. 5B) and suitable modifications of the detector circuits provided to detect such pulses. To generate such pulses, a capacitor charged from the AC line can be discharged to superimpose pulses on the power supply signal.

The present invention achieves a touch control switch system which permits intercommunication between different touch controlled switch circuits over the power supply line. The system enables a touch controlled switch circuit to operate either in response to local touch inputs at the circuit or in response to remote touch inputs which generate coded message signals on the power supply line. Further, the system enables a plurality of remote touch controlled switch circuits to be selectively operated by a master touch controlled switch circuit.

The present invention in its broader aspects is not limited to the specific details shown and described, and modifications may be made in the details of the touch controlled switch system without departing from the principles of the present invention.

What is claimed is:

1. A touch controlled switch system operable by local touch inputs and binary coded message signals generated by remote touch inputs and transmitted over an AC power line for operating a load device, comprising:

a first touch controlled switch circuit including a first touch receptor operable by electrical contact with a human body in response to an induced hum pickup signal derived from an AC power supply signal on the power line and a message code generator responsive to said first touch receptor for superimposing different binary coded message signals on the AC power supply signal upon the occurrence of different touch inputs at said first touch receptor; and a second touch controlled switch circuit including a second touch receptor operable by electrical contact with a human body in response to the induced hum pickup signal derived from the AC power supply signal and a control circuit responsive to said second touch receptor for operating a load device coupled to said control circuit upon the occurrence of different touch inputs at said second touch receptor, said second touch controlled switch circuit including a message detector coupled to the power line for detecting the binary coded message signals superimposed on the AC power supply signal and a message decoder responsive to said message detector for selectively actuating said control circuit to operate said load device in response to the different binary coded message signals produced by different touch inputs at said first touch receptor.

2. The touch controlled switch system of claim 1, wherein:

said first touch controlled switch circuit includes a first touch detector coupled to said first touch receptor for sensing touch inputs applied to said first touch receptor and a first touch decoder responsive to said first touch detector for identifying different touch inputs; and said message code generator comprises a message selection circuit responsive to said first touch decoder for generating different binary coded message signals to be applied to the power supply signal in response to the different touch inputs.

3. The touch controlled switch system of claim 2, wherein said second touch controlled switch circuit includes:

a second touch detector coupled to said second touch receptor for sensing touch inputs applied to said second touch receptor and a second touch decoder responsive to said second touch detector for identifying different touch inputs and selectively operating said control circuit in response to the different touch inputs.

4. The touch controlled switch system of claim 2, wherein said message code generator includes:

means for applying the binary coded message signals from said message selection circuit to the AC power line near the peaks of the power supply signal.

5. The touch controlled switch system of claim 4, wherein each binary coded message signal consists of a series of bits superimposed on successive peaks of the power supply signal.

6. The touch controlled switch system of claim 5, wherein said second touch controlled switch circuit includes:

a bit identifier coupled to said message detector for identifying the bits applied to the power supply signal and supplying the bits to said message decoder.

7. The touch controlled switch system of claim 1, wherein said first touch controlled switch circuit includes:

a control circuit responsive to said first touch receptor for operating a load device coupled thereto upon the occurrence of different touch inputs at said first touch receptor.

8. A touch controlled switch system operable by local touch inputs and binary coded message signals generated by remote touch inputs and transmitted over an AC power line for selectively operating a plurality of load devices, comprising:

a master touch controlled switch circuit including a first touch receptor operable by electrical contact with a human body in response to an induced hum pickup signal derived from an AC power supply signal on the power line and a message code generator responsive to said first touch receptor for superimposing different binary coded message signals on the AC power supply signal in response to different touch inputs at said first touch receptor; and a plurality of remote touch controlled switch circuits each including a second touch receptor operable by electrical contact with a human body in response to the induced hum pickup signal derived from the AC power supply signal and a control circuit responsive to said second touch receptor for selectively operating a load device coupled to said control circuit in response to different local touch inputs at said second touch receptor, each remote touch controlled switch circuit including a message detector coupled to the power line for detecting the different binary coded message signals and a message decoder responsive to the binary coded message signals directed to said remote touch controlled switch circuit for actuating its control circuit to operate the load device in response to the binary coded message signals produced by remote touch inputs at said first touch receptor.

9. The touch controlled switch system of claim 8, wherein said message code generator comprises:

an address selection unit for generating binary address signals identifying desired remote touch controlled switch circuits to be operated and a command selection unit for generating binary command signals identifying desired switch functions to be performed at the selected touch controlled switch circuits.

10. The touch controlled switch system of claim 9, wherein each binary address and command signal consists of a series of bits superimposed near successive peaks of the power supply signal.

11. The touch controlled switch system of claim 10, wherein each remote touch controlled switch circuit includes:

a bit identifier coupled to its message detector for identifying the bits applied to the power supply signal and supplying the bits to said message decoder.

12. The touch controlled switch system of claim 8, wherein said master touch controlled switch circuit includes:

a control circuit responsive to said first touch receptor for operating a load device coupled thereto upon the occurrence of different touch inputs at said first touch receptor.

13. A touch controlled switch system operable by touch inputs to transmit binary coded message signals over an AC power supply line and operate a load device, comprising:

transmitting means including a touch receptor operable by electrical contact with a human body in response to an induced hum pickup signal derived from an AC power supply signal on the power line and a message code generator responsive to said touch receptor for superimposing different binary coded message signals on the AC power supply signal in response to different touch inputs applied to said touch receptor; and receiving means including a control circuit for operating a load device coupled thereto and a message decoder responsive to the different binary coded message signals superimposed on the AC power supply signal for selectively actuating said control circuit to operate the load device in response to different touch inputs applied to said touch receptor.

14. The touch controlled switch system of claim 13, wherein said transmitting means includes:

means for applying the binary coded message signals to the AC power line near the peaks of the power supply signal.

15. The touch controlled switch system of claim 13, wherein each binary coded message signal consists of a series of bits superimposed on successive peaks of the power supply signal.

* * * * *